United States Patent [19]
Gorecki et al.

[11] Patent Number: 5,510,738
[45] Date of Patent: Apr. 23, 1996

[54] CMOS PROGRAMMABLE RESISTOR-BASED TRANSCONDUCTOR

[75] Inventors: James L. Gorecki; Yaohua Yang, both of Hillsboro, Oreg.

[73] Assignee: Lattice Semiconductor Crop., Hillsboro, Oreg.

[21] Appl. No.: 403,359

[22] Filed: Mar. 14, 1995

Related U.S. Application Data

[63] Continuation-in-part of Ser. No. 396,994, Mar. 1, 1995.
[51] Int. Cl.$^6$ ........................ H03F 3/45
[52] U.S. Cl. ............... 327/103; 327/561; 330/254; 330/260
[58] Field of Search ................ 327/519, 53, 52, 327/54, 66, 67, 103, 560, 561, 563, 538; 330/254, 260

[56] References Cited

U.S. PATENT DOCUMENTS

| | | | |
|---|---|---|---|
| 4,100,433 | 7/1978 | Duffy et al. | 327/103 |
| 4,134,078 | 1/1979 | Arai et al. | 330/254 |
| 4,462,003 | 7/1984 | Takamatsu | 330/254 |
| 4,667,166 | 5/1987 | Itoh | 330/260 |
| 5,404,097 | 4/1995 | Barou | 330/260 |

OTHER PUBLICATIONS

Scott D. Willingham et al. "A BiCMOS Low–Distortion 8–MHz Low–Pass Filter", IEEE Journal of Solid–State Circuits, vol. 28, No. 12, Dec. 1993, pp. 1234–1245.

Primary Examiner—Timothy P. Callahan
Assistant Examiner—Jung Ho Kim
Attorney, Agent, or Firm—Skjerven, Morrill, MacPherson, Franklin & Friel; Andrew C. Graham

[57] ABSTRACT

A CMOS programmable resistor-based transconductor receives a differential input voltage and generates a differential output current. The transconductor includes a degenerate pair of transistors linearized by servo feedback, and further includes a string of series-connected resistors defining a group of tap points. Two selected tap points in the resistor string are selected by digital control of MOS switches and are connected, respectively, to the feedback input of the two amplifiers in the feedback loops. Because no DC current flows through the MOS switches into the high impedance inputs of the amplifiers, the differential input voltage is impressed across a portion of the resistor string residing between the two selected tap points, and the conversion gain is determined by the value of this portion of the resistor string.

23 Claims, 4 Drawing Sheets

CMOS PROGRAMMABLE RESISTOR-BASED TRANSCONDUCTOR

CROSS REFERENCE TO RELATED APPLICATION

This application is a continuation in part of copending, commonly assigned U.S. patent application Ser. No. 08/396,994, filed on Mar. 1, 1995, entitled Continuous Time Programmable Analog Block Architecture and having the Attorney Docket Number M-3102-US. The above-referenced application is incorporated herein by reference in its entirety.

BACKGROUND OF THE INVENTION

1. Field of the Invention

This invention relates to analog circuits for converting an input voltage into an output current, and more particularly to analog circuits for converting a differential input voltage to a differential output current.

2. Description of Related Art

A transconductor is a circuit which receives an input voltage and generates an output current. The magnitude of the output current is proportional to the input voltage received, and the ratio by which the output current changes for a given ratio of input voltage change is known as the conversion gain, or transconductance ($G_m = \Delta I_{out}/V_{IN}$) of the transconductor. A differential transconductor receives a differential voltage impressed between two voltage input terminals, and generates a differential current between two current output terminals. The common-mode voltage of the two voltage input terminals is ignored. In other words, a first current is generated on one of the current output terminals, and a second current is generated on the other current output terminal, and the difference between the first and second currents is known as the differential current appearing at the pair of current output terminals.

Figure 1:
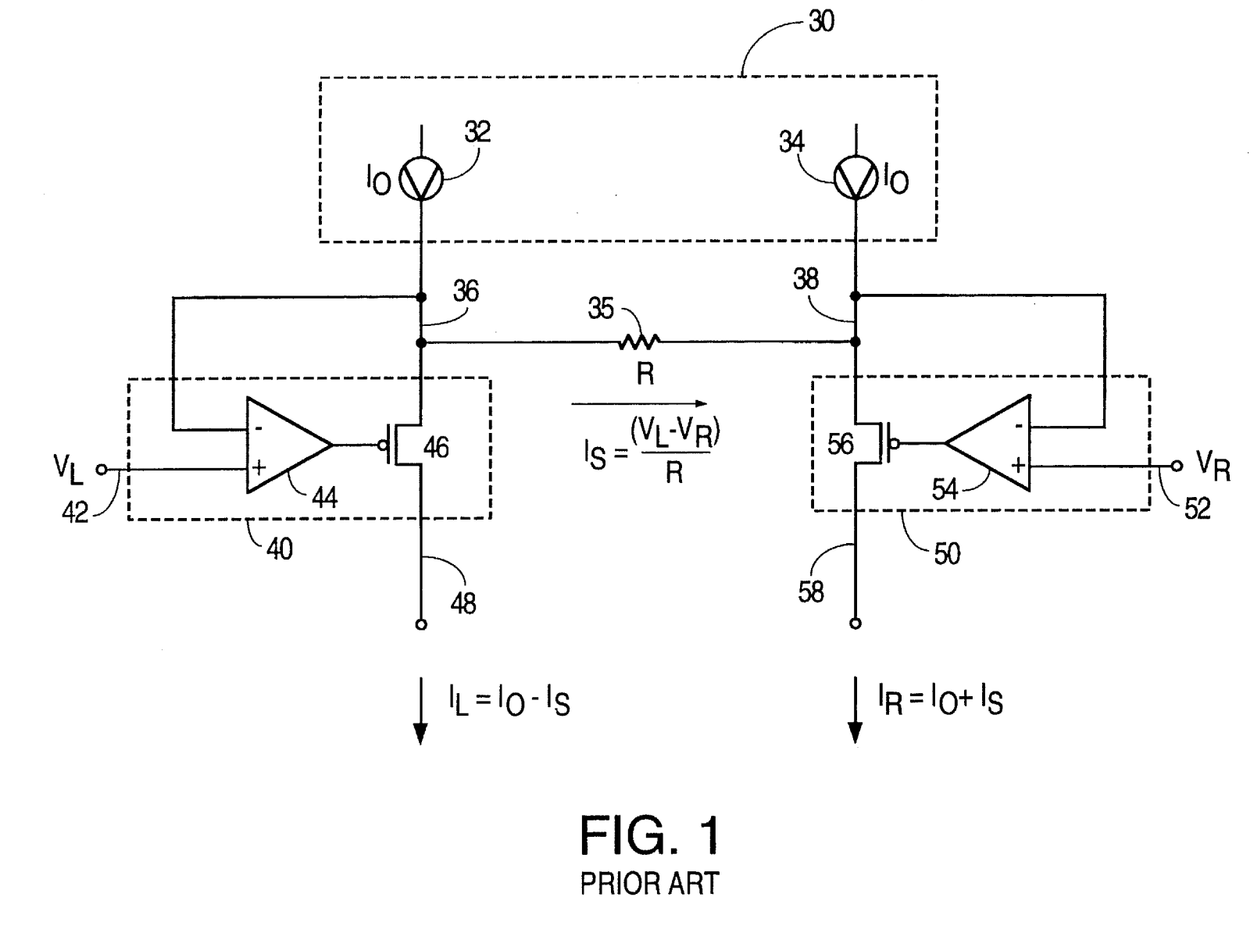
FIG. 1 is a schematic diagram of a prior art differential transconductor.

A differential transconductor known in the art is shown in FIG. 1. A differential input voltage, $V_L - V_R$, is received between voltage input terminals 42 and 52, and a corresponding differential output current is generated between current output terminals 48 and 58. A current source circuit 30 includes a current source 32 which delivers a current of magnitude $I_O$ into summing node 36 and further includes a current source 34 which delivers a current of magnitude $I_O$ into summing node 38. Input circuit 40, which enhances the transconductance of transistor 46, includes an op-amp 44 having a non-inverting input coupled to the voltage input terminal 42 and an inverting input coupled to the summing node 36. The output of op-amp 44 drives the gate of transistor 46, which is a P channel MOS transistor. Transistor 46 couples summing node 36 to the current output terminal 48. A second input circuit 50, which enhances the transconductance of transistor 56, includes an op-amp 54 having a non-inverting input coupled to the voltage input terminal 52 and an inverting input coupled to summing node 38. The output of op-amp 54 drives the gate of transistor 56, which is also a P channel MOS transistor. Transistor 56 couples summing node 38 to the current output terminal 58. A resistor 35 having a resistance of R ohms couples summing node 36 to summing node 38. As is common with differential circuits, current source 32 and input circuit 40 are matched to current source 34 and input circuit 50, respectively, to provide balanced differential operation.

The operation of this circuit can best be understood by looking initially at the left-most portion. Input circuit 40 functions to force the voltage of summing node 36 to follow the input voltage, $V_L$, received on voltage input terminal 42. This occurs because the op-amp 44 drives the gate of transistor 46 to a suitable voltage such that the voltage of summing node 36, which is coupled to the inverting input of op-amp 44, follows the input voltage, $V_L$, coupled to the non-inverting input of op-amp 44. For example, if the voltage of summing node 36 is too high, the output of op-amp 44 is driven lower, thus providing more gate drive to P channel transistor 46. Consequently, a higher current flows through transistor 46 which lowers the voltage of summing node 36 until the voltage at summing node 36 is equal to the voltage at non-inverting input terminal of op-amp 44. Similarly, for the right-most portion, input circuit 50 functions to force the voltage of summing node 38 to follow the input voltage, $V_R$, received on voltage input terminal 52 of op-amp 54. This occurs because the op-amp 54 drives the gate of transistor 56 to a suitable voltage such that the voltage of summing node 38, which is coupled to the inverting input of op-amp 54, follows the input voltage, $V_R$, coupled to the non-inverting input of op-amp 54. Thus, with the voltage of summing node 36 following input voltage $V_L$ and the voltage of summing node 38 following input voltage $V_R$, the differential input voltage $V_L - V_R$ is placed across resistor 35, and causes a current $I_S$ of magnitude $(V_L - V_R)/R$ to flow from summing node 36 to summing node 38. If $V_R$ is greater in magnitude than $V_L$ then a negative current $I_S$ flows from summing node 36 to summing node 38 which, of course, is equivalent to a positive current flow from summing node 38 to summing node 36.

Summing node 36 receives a current $I_O$ from current source 32, and sources a current $I_S$ flowing into summing node 38. Thus, the net current which is provided to the source of transistor 46 is $I_O - I_S$. The current, $I_L$, coupled to current output terminal 48 must also be equal to $I_O - I_S$ because the sum of currents received into any node must equal zero. Similarly, summing node 38 receives a current $I_O$ from current source 34, and receives a current $I_S$ flowing from summing node 36. Thus, the net current received into summing node 38 is $I_O + I_S$, which is coupled by transistor 56 to the current output terminal 58 as $I_R = I_O + I_S$.

The topology of this circuit is generally known as a degenerated pair linearized by servo-feedback, and is also known as a linearized resistor-based transconductor. The distortion produced by transistors 46 and 56 is reduced by the loop gain of the op-amps 44, 54, respectively. The use of a resistor in setting the conversion gain of the transconductor results in high linearity, but also results in a conversion gain which is fixed by the choice of resistor value, and which varies with semiconductor process parameter variations. Notwithstanding these advantages, additional flexibility is desired to allow a wider variety of usage. In particular, a programmable transconductor would allow selecting the desired conversion gain after semiconductor manufacturing.

SUMMARY OF THE INVENTION

It is an object of the present invention to provide a programmable transconductor having a conversion gain selectable from a range of choices.

It is a further object of the present invention to provide a programmable transconductor which preserves the advantages of existing circuits.

In one embodiment, the invention relates to a programmable transconductor for generating a differential current between first and second current output terminals responsive to a differential voltage operably impressed between first and second voltage input terminals. The transconductor includes a current source circuit configured to deliver a predetermined amount of current into each of a first summing node and a second summing node; a resistor circuit coupled between the first and second summing nodes, the resistor circuit comprising a plurality of individual resistors connected in series and defining a plurality of intermediate nodes between adjacent resistors; a first plurality of switch circuits, each having a first terminal coupled to a corresponding intermediate node of the resistor circuit, and each further having a second terminal coupled to a first feedback node; a second plurality of switch circuits, each having a first terminal coupled to a corresponding intermediate node of the resistor circuit, and each further having a second terminal coupled to a second feedback node; a first gain block having a first input coupled to the first voltage input terminal, a second input coupled to the first feedback node, and an output; a first transistor having a first current-handling terminal coupled to the first summing node, having a second current-handling terminal coupled to the first current output terminal, and having a control terminal coupled to the output of the first gain block; a second gain block having a first input coupled to the second voltage input terminal, a second input coupled to the second feedback node, and an output; and a second transistor, having a first current-handling terminal coupled to the second summing node, having a second current-handling terminal coupled to the second current output terminal, and having a control terminal coupled to the output of the second gain block.

DETAILED DESCRIPTION OF THE PREFERRED EMBODIMENTS

Figure 2:
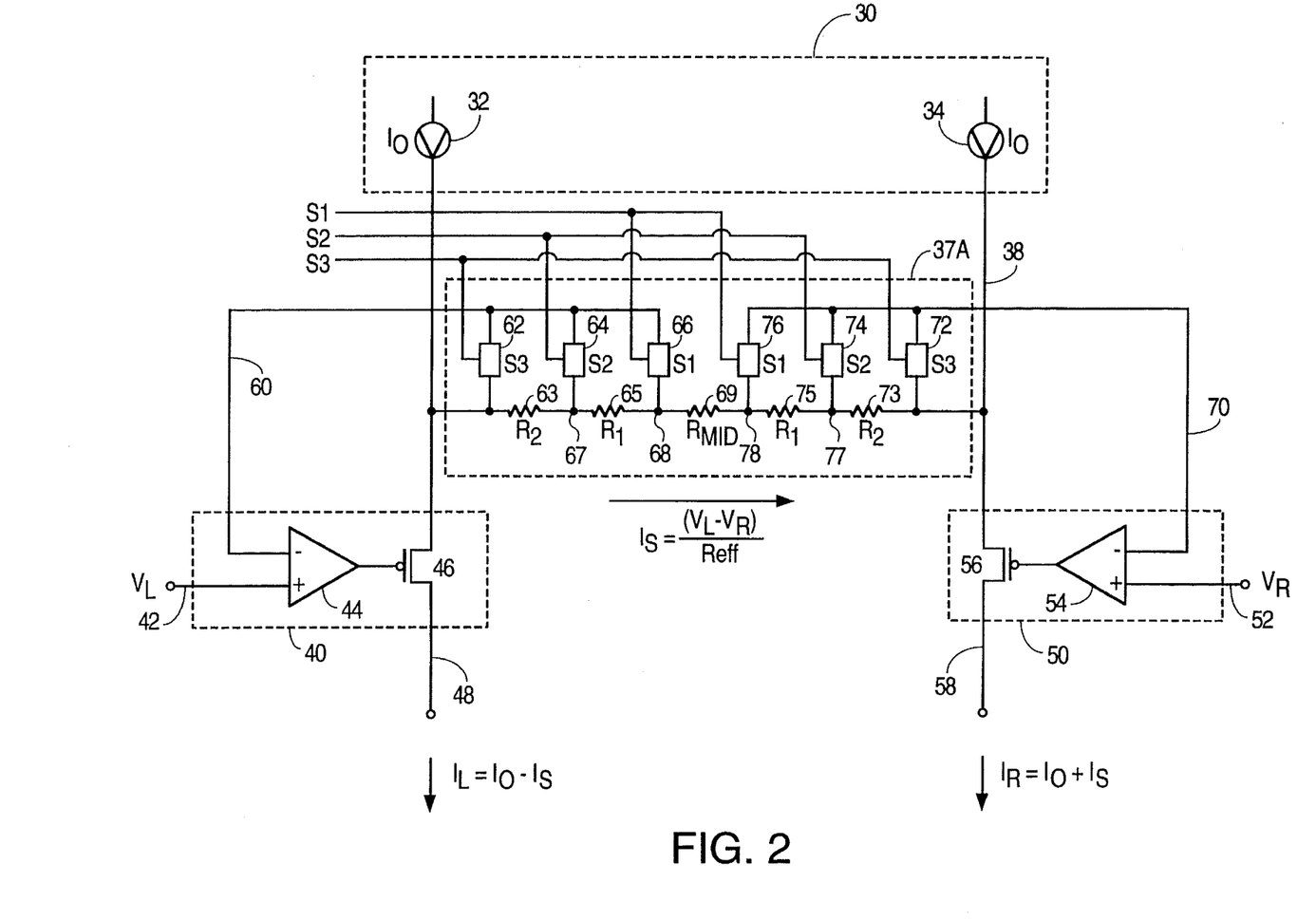
FIG. 2 is a schematic diagram of a transconductor in accordance with the current invention.

One embodiment of a differential transconductor in accordance with the present invention is shown in FIG. 2. A differential input voltage, $V_L-V_R$, is received between voltage input terminals 42 and 52, and a corresponding differential output current is generated between current output terminals 48 and 58. A current source circuit 30 includes a current source 32 which delivers a current of magnitude $I_O$ into summing node 36 and further includes a current source 34 which delivers a current of magnitude $I_O$ into summing node 38. Input circuit 40 includes an op-amp 44 (functioning as a gain block) having a non-inverting input coupled to the voltage input terminal 42 and an inverting input coupled to a first feedback node 60. The output of op-amp 44 drives the gate of transistor 46, which in this embodiment is a P channel MOS transistor. Transistor 46 couples summing node 36 to the current output terminal 48. A second bias circuit 50 includes an op-amp 54 having a non-inverting input coupled to the voltage input terminal 52 and an inverting input coupled to a second feedback node 70. The output of op-amp 54 drives the gate of transistor 56, which in this embodiment is also a P channel MOS transistor. Transistor 56 couples summing node 38 to the current output terminal 58.

Circuit 37A includes a selector circuit having an array of switch circuits and includes a resistor circuit having a total resistance of R ohms coupling summing node 36 to summing node 38, and which resistor circuit includes resistors 63, 65, 69, 75, and 73 connected in series and defining a group of intermediate nodes 67, 68, 78, and 77 respectively therebetween. These intermediate nodes, together with summing nodes 36 and 38, form a group of tap nodes of the resistor circuit.

The selector circuit includes an array of switch circuits. Switch circuit 62 couples summing node 36 to feedback node 60 when enabled by logical signal S3. Switch circuit 64 couples intermediate node 67 to feedback node 60 when enabled by logical signal S2, and switch circuit 66 couples intermediate node 68 to feedback node 60 when enabled by logical signal S1. Similarly, switch circuit 72 couples summing node 38 to feedback node 70 when enabled by logical signal S3, switch circuit 74 couples intermediate node 77 to feedback node 70 when enabled by logical signal S2, and switch circuit 76 couples intermediate node 78 to feedback node 70 when enabled by logical signal S1. Logical signals S1, S2, and S3 are preferably digital control signals which select the desired transconductance of the circuit, but may also be a hardwired or some other fixed connection.

The operation of this embodiment can best be understood by first assuming (for example) that logical signal S2 is active, and thus switch circuits 64 and 74 are enabled and remaining switch circuits 62, 66, 72, and 76 are disabled. Since intermediate node 67 is coupled to feedback node 60 which is coupled to the inverting input of op-amp 44, input circuit 40 functions to force the voltage of feedback node 60 and intermediate node 67 to follow the voltage, $V_L$, received on voltage input terminal 42. Assuming $V_L$ is greater than $V_R$ and thus $I_S$ is positive, op-amp 44 drives the gate of transistor 46 to a suitable voltage such that the voltage of summing node 36 is driven to a voltage higher than $V_L$, so that the voltage of feedback node 60, which is coupled to the inverting input of op-amp 44, follows the input voltage $V_L$. Due to the high input impedance of op-amp 44, virtually no DC current flows through switch circuit 64 and consequently the voltage of feedback node 60 follows the voltage of intermediate node 67 with negligible voltage drop, noise, or distortion effects.

Similarly, for the right-most portion, input circuit 50 functions to force the voltage of intermediate node 77 to follow the voltage, $V_R$, received on voltage input terminal 52. Thus, with feedback node 60 following input voltage $V_L$ and feedback node 70 following input voltage $V_R$, and since no DC current flows through switch circuits 64 and 74 (due to the high input impedance of op-amps 44 and 54), the differential input voltage $V_L-V_R$ is placed directly across an effective resistance, $R_{eff}$, consisting of resistors 65, 69, and 75 (since for this discussion logical signal S2 is active). This causes a current $I_S$ of magnitude $(V_L-V_R)/R_{eff}$ to flow from summing node 36 to summing node 38. If $V_R$ is greater in magnitude than $V_L$ then a negative current $I_S$ flows from summing node 36 to summing node 38 which, of course, is equivalent to a positive current flow from summing node 38 to summing node 36.

Summing node 36 receives a current $I_O$ from current source 32, and sources a current $I_S$ flowing into summing node 38. Thus, the net current which is provided to transistor 46 is $I_O-I_S$, which is then coupled by transistor 46 to the current output terminal 48. Similarly, summing node 38 receives a current $I_O$ from current source 34, and receives a current $I_S$ flowing from summing node 36. Thus, the net current provided to transistor 56 is $I_O+I_S$, which is then coupled by transistor 56 to the current output terminal 58.

Even though the magnitude of the current $I_S$ is set by the input differential voltage $V_L-V_R$ impressed across only the effective resistor, $R_{eff}$, formed by those resistors connected between the selected tap nodes which are coupled to the feedback nodes 60 and 70, the current $I_S$ flows through all the series-connected resistors connected between summing nodes 36 and 38 (in this embodiment, resistors 63, 65, 69, 75, and 73).

Because $I_S=(V_L-V_R)/R_{eff}$, higher conversion gain is accomplished by smaller values of effective resistance. Consequently, for this embodiment the highest conversion gain is achieved by enabling S1, and the lowest conversion gain is achieved by enabling S3.

This programmable topology is achieved by using a string of series-connected resistors, with a group of switch circuits to selectively "tap off" two nodes from the string, and to feedback these nodes to the inverting inputs of the op-amps 44 and 54, respectively. In a preferred embodiment, the selected nodes are symetrically displaced around resistor 69. By changing the taps, the value of the effective resistor $R_{eff}$ is varied, with a resultant change in the transconductance $G_m$ (which varies as $1/R_{eff}$). Individual switch circuits are enabled by digital control signals which are provided based upon information which is stored in internal or external memory.

Figures 3, 4:
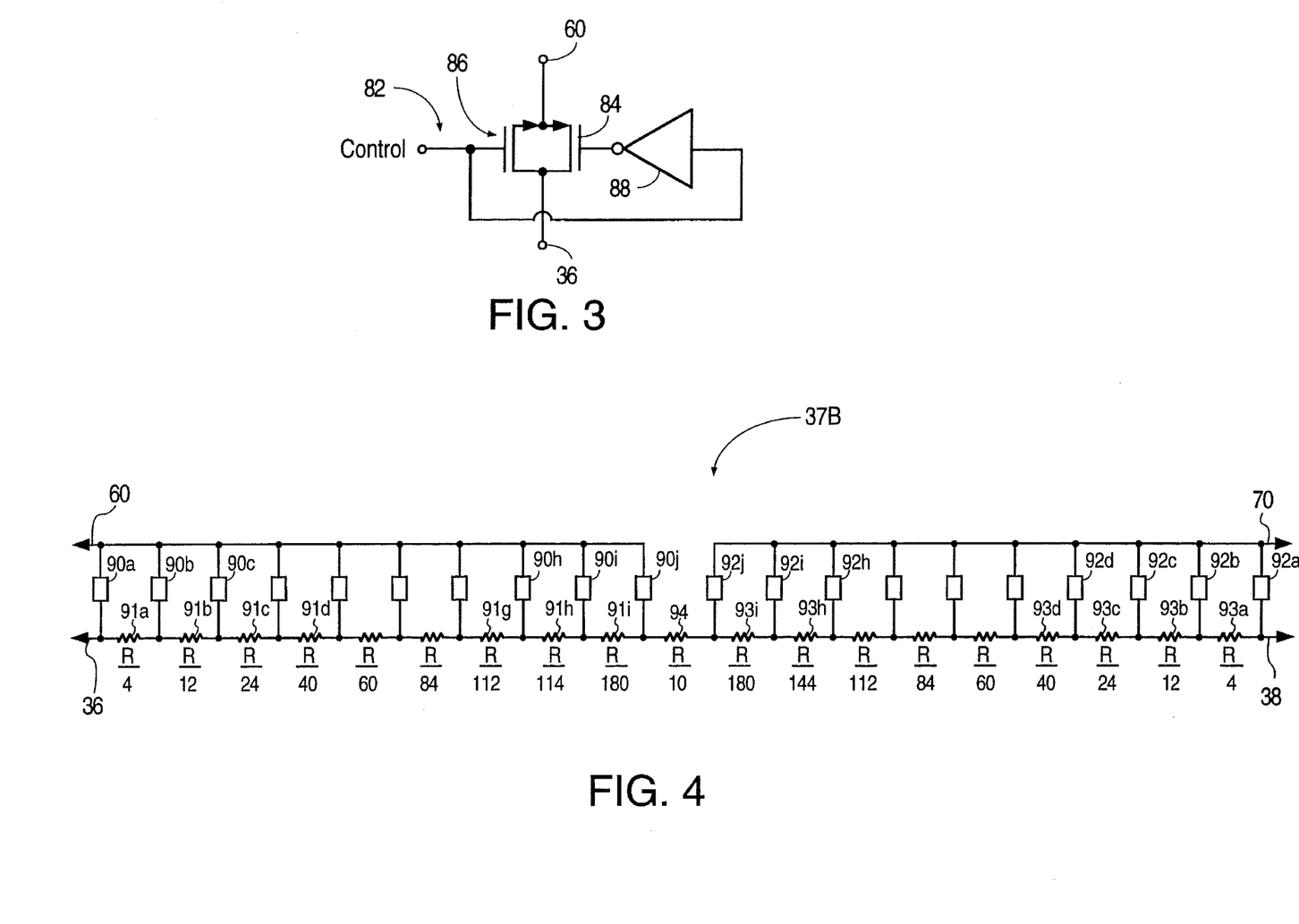
FIG. 3 is a schematic diagram of a switch circuit of the selector circuit of the FIG. 2 transconductor in accordance with the present invention.
FIG. 4 is a schematic diagram of an alternative circuit useful for the transconductor shown in FIG. 2.

Referring to FIG. 3, switch circuit 62 is shown which is exemplative of switch circuits 64, 66, 72, 74, 76. Switch circuit 62 includes CMOS transfer gates 84, 86 as well as inverter 88 which generates the complement of the switch circuit's enable signal, i.e., the S3 signal.

Referring again to FIG. 2, the distortion produced by transistors 46 and 56 is reduced by the loop gain of op-amps 44, 54, respectively. The use of a group of series-connected resistors in setting the conversion gain of the transconductor results in a high linearity at any gain setting. Since the gain is programmable by selectively enabling a corresponding pair of switch circuits, the gain is not fixed by the choice of single resistor value. Further, resistor matching within a single silicon integrated circuit ensures that the ratio of transconductances is accurate to less than 3%.

Preferably, as this circuit is a balanced differential circuit, the left-hand and right-hand resistors associated with each tap (e.g., resistors 65 and 75 being associated with enable signal S2 which enables switch circuits 64 and 74, respectively) have the same value, i.e., are balanced. The number of taps within the resistor string is not fundamentally limited, although for high frequency operation the parasitic capacitances associated with MOS switches or resistors may degrade performance. The resistors may be sized to produce any monotonic function. The resistors are preferably implemented as either thin film or polysilicon resistors when in an integrated circuit implementation.

Referring to FIG. 4, a preferred embodiment of the resistor circuit is shown. Summing node 36 is coupled to summing node 38 by a string of resistors including resistors 91a through 91i, resistor 94, and resistors 93a through 93i, having an aggregate resistance value, $R_{total}$, for example, of 100 Kohms. By selecting the taps off of the resistor string, the effective transconductance of the transconductor may be programmably varied between $G_M=1$ to $G_M=10$.

More specifically, resistors 91a and 93a have a resistance of R/4 ohms, resistors 91b and 93b have a resistance of R/12 ohms, resistors 91c and 93c have a resistance of R/24 ohms, resistors 91d and 93d have a resistance of R/40 ohms, resistors 91e and 93e have a resistance of R/60 ohms, resistors 91f and 93f have a resistance of R/84 ohms, resistors 91g and 93g have a resistance of R/112 ohms, resistors 91h and 93h have a resistance of R/144 ohms, resistors 91i and 93i have a resistance of R/180 ohms and resistor 94 has a value of R/10.

For any of these embodiments, op-amps 44 and 54 may be implemented in a variety of technologies and topologies, and the particular implementation is not pertinent to the operation of the transconductor. For example, CMOS folded cascode circuits and CMOS two-stage amplifier circuits may be used, as well as bipolar implementations or BiCMOS implementations. As long as the input impedance relatively high, e.g., $<10^8$ ohms, the implementation details of the op-amps are not significant to the programmability aspect of the transconductor circuit.

A transistor may be conceptualized as having a control terminal which controls the flow of current between a first current handling terminal and a second current handling terminal. An appropriate condition on the control terminal causes a current to flow from/to the first current handling terminal and to/from the second current handling terminal. In a bipolar NPN transistor, the first current handling terminal is the collector, the control terminal is the base, and the second current handling terminal is the emitter. A sufficient current into the base causes a collector-to-emitter current to flow. In a bipolar PNP transistor, the first current handling terminal is the emitter, the control terminal is the base, and the second current handling terminal is the collector. A current exiting the base causes an emitter-to-collector current to flow.

A MOS transistor may likewise be conceptualized as having a control terminal which controls the flow of current between a first current handling terminal and a second current handling terminal. Although MOS transistors are frequently discussed as having a drain, a gate, and a source, in most such devices the drain is interchangeable with the source. This is because the layout and semiconductor processing of the transistor is symmetrical (which is typically not the case for bipolar transistors). For an N-channel MOS transistor, the current handling terminal normally residing at the higher voltage is customarily called the drain. The current handling terminal normally residing at the lower voltage is customarily called the source. A sufficient voltage on the gate causes a current to therefore flow from the drain to the source. The gate to source voltage referred to in an N channel MOS device equations merely refers to whichever diffusion (drain or source) has the lower voltage at any given time. For example, the "source" of an N channel device of a bi-directional CMOS transfer gate depends on which side of the transfer gate is at a lower voltage. To reflect the symmetry of most N channel MOS transistors, the control terminal is the gate, the first current handling terminal may be termed the "drain/source", and the second current handling terminal may be termed the "source/drain". Such a description is equally valid for a P channel MOS transistor, since the polarity between drain and source voltages, and the direction of current flow between drain and source, is not implied by such terminology. Alternatively, one current -handling terminal may be arbitrarily deemed the "drain" and the other deemed the "source", with an implicit understanding that the two are not distinct, but interchangeable.

Figure 5:
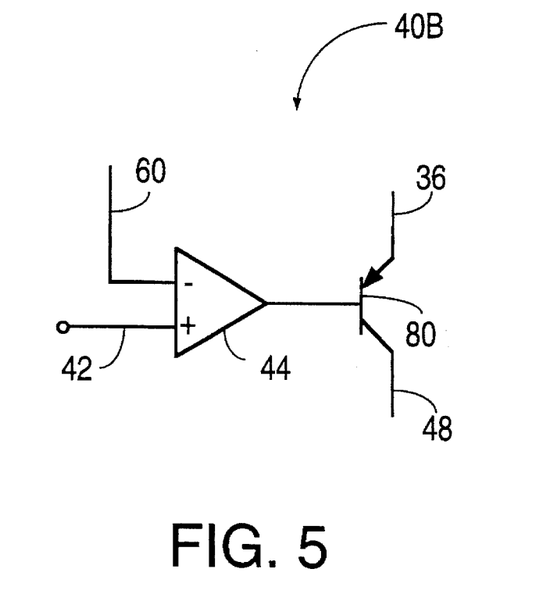
FIG. 5 is a schematic diagram of an alternative input circuit useful for the transconductor shown in FIG. 2.
Figure 6:
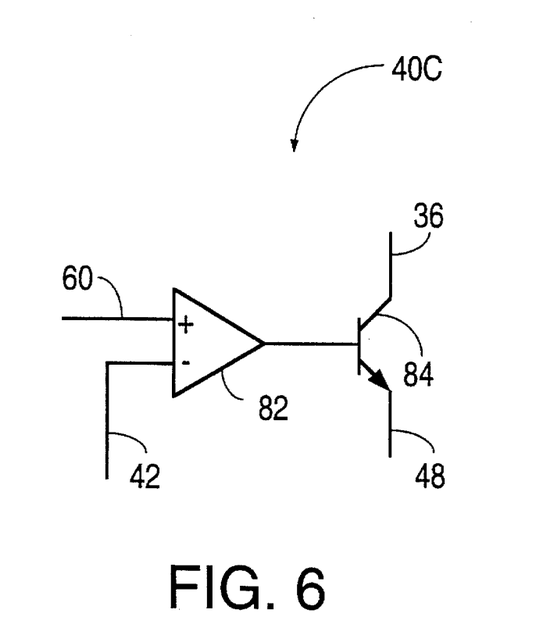
FIG. 6 is a schematic diagram of another alternative input circuit useful for the transconductor shown in FIG. 2.

A variety of input circuit configurations may also be utilized with the present invention. The role of transistor 46 and 56 shown in the embodiment of FIG. 2 may be advantageously provided by either N channel or P channel MOS transistors or by NPN or PNP bipolar transistors, with a corresponding reversal of summing nodes and output current nodes. For example, FIG. 5 shows an input circuit 40B which includes an op-amp 44 connected to drive the base of PNP bipolar transistor 80, which couples the net current received into summing node 36 to the current output terminal 48. Alternately, FIG. 6 shows an input circuit 40C which includes an op-amp 82 connected to drive the base of NPN bipolar transistor 84, which couples the net current received into summing node 36 to the current output terminal 48. In this embodiment, the feedback node 60 is connected to the non-inverting input and the voltage input terminal 42 is connected to the inverting input of op-amp 82.

The current source circuit 30 may be advantageously implemented in a number of different ways. Identically biased MOS transistors may be used to achieve the current sources 32 and 34, for example, as in a current mirror configuration. Cascode devices may optionally be used to raise the output impedance of such current sources.

While the invention has been described with respect to the embodiments set forth above, the invention is not necessarily limited to these embodiments. Accordingly, other embodiments, variations, and improvements not described herein are not necessarily excluded from the scope of the invention, which is defined by the following claims.

What is claimed is:

1. A programmable transconductor for generating a differential current between first and second current output terminals responsive to a differential voltage operably impressed between first and second voltage input terminals, comprising:
    a current source circuit configured to deliver a predetermined amount of current into each of a first summing node and a second summing node;
    a resistor circuit coupled between the first and second summing nodes, the resistor circuit comprising a plurality of individual resistors connected in series and defining a plurality of intermediate nodes between adjacent resistors;
    a first plurality of switch circuits, each having a first terminal coupled to a corresponding intermediate node of the resistor circuit, and each further having a second terminal coupled to a first feedback node;
    a second plurality of switch circuits, each having a first terminal coupled to a corresponding intermediate node of the resistor circuit, and each further having a second terminal coupled to a second feedback node;
    a first gain block having a first input coupled to the first voltage input terminal, a second input coupled to the first feedback node, and an output;
    a first transistor having a first current-handling terminal coupled to the first summing node, having a second current-handling terminal coupled to the first current output terminal, and having a control terminal coupled to the output of the first gain block;
    a second gain block having a first input coupled to the second voltage input terminal, a second input coupled to the second feedback node, and an output; and
    a second transistor, having a first current-handling terminal coupled to the second summing node, having a second current-handling terminal coupled to the second current output terminal, and having a control terminal coupled to the output of the second gain block.

2. A programmable transconductor as in claim 1:
    wherein the plurality of individual resistors comprises
        a first group of resistors connected in series and defining a first group of intermediate nodes associated therewith;
        a second group of resistors connected in series and defining a second group of intermediate nodes associated therewith;
        a middle resistor coupled between the first group and the second group;
    wherein each of the first plurality of switch circuits is respectively coupled to each of the first group of intermediate nodes; and
    wherein each of the second plurality of switch circuits is respectively coupled to each of the second group of intermediate nodes.

3. A programmable transconductor as in claim 2 wherein the first and second groups of resistors are balanced.

4. A programmable transconductor as in claim 1 wherein the first and second plurality of switch circuits comprise CMOS transfer gate circuits.

5. A programmable transconductor as in claim 4 wherein the CMOS transfer gate circuits are enabled by digital control signals.

6. A programmable transconductor as in claim 1:
    wherein each of the first inputs of the first and second gain blocks comprises a non-inverting input; and
    wherein each of the second inputs of the first and second gain blocks comprises an inverting input.

7. A programmable transconductor as in claim 1 wherein each of the first and second transistors comprises a transistor chosen from a group consisting of P-channel MOS transistors, N-channel MOS transistors, PNP bipolar transistors, and NPN bipolar transistors.

8. A programmable transconductor as in claim 2:
    wherein each of the first inputs of the first and second gain blocks comprises a non-inverting input; and
    wherein each of the second of the first and second gain blocks comprises an inverting input.

9. A programmable transconductor as in claim 8:
    wherein the first transistor comprises a P channel MOS transistor having a source/drain terminal coupled to the first summing node, a gate terminal coupled to the output of the first gain block, and a drain/source terminal coupled to the first current output terminal; and
    wherein the second transistor comprises a P channel MOS transistor having a source/drain terminal coupled to the second summing node, a gate terminal coupled to the output of the second gain block, and a drain/source terminal coupled to the second current output terminal.

10. A programmable transconductor as in claim 9 wherein the first and second groups of resistors are balanced.

11. A programmable transconductor as in claim 10 wherein the first and second plurality of switch circuits comprise CMOS transfer gate circuits enabled by digital control signals.

12. A programmable transconductor for generating a differential current between first and second current output terminals responsive to a differential voltage operably impressed between first and second voltage input terminals, comprising:
    a current source circuit configured to deliver a predetermined mount of current into each of a first summing node and a second summing node;
    a resistor circuit coupled between the first and second summing nodes, the resistor circuit comprising a plurality of individual resistors connected in series and defining a plurality of intermediate nodes between adjacent resistors;

a first selector circuit for operably coupling a first selected one of the plurality of intermediate nodes to a first feedback node;

a second selector circuit for operably coupling a second selected one of the plurality of intermediate nodes to a second feedback node;

a first input circuit, coupled to the first summing node, the first feedback node, and the first voltage input terminal, for operably biasing the first summing node to a suitable voltage to bias the first feedback node to a voltage equal to a voltage operably impressed upon the first voltage input terminal;

a second input circuit, coupled to the second summing node, the second feedback node, and the second voltage input terminal, for operably biasing the second summing node to a suitable voltage to bias the second feedback node to a voltage equal to a voltage impressed upon the second voltage input terminal;

thereby operably causing a resistor current to flow through the resistor circuit from the first summing node to the second summing node corresponding to a voltage difference between the first and second selected intermediate nodes divided by a sum of the resistors connected therebetween, resulting in a net current into the first summing node equal to the predetermined amount of current delivered thereinto minus the resistor current, and further resulting in a net current into the second summing node equal to the predetermined amount of current delivered thereinto plus the resistor current;

wherein the net current into each of the first and second summing nodes is operably coupled to the first and second current output terminals, respectively, thereby resulting in a differential current between the first and second current output terminals corresponding to the differential voltage operably impressed between the first and second voltage input terminals divided by the sum of the resistors coupled between the first and second selected intermediate nodes; and wherein the first and second selected intermediate nodes are chosen to select a transconductance value from a range of selectable transconductance values.

13. A programmable transconductor as in claim 12: wherein the plurality of individual resistors comprises a first group of resistors connected in series and defining a first group of intermediate nodes associated therewith;

a second group of resistors connected in series and defining a second group of intermediate nodes associated therewith;

a middle resistor coupled between the first group and the second group;

wherein the first selected one of the plurality of intermediate nodes is chosen from the first group of intermediate nodes; and wherein the second selected one of the plurality of intermediate nodes is chosen from the second group of intermediate nodes.

14. A programmable transconductor as in claim 13 wherein the first and second groups of resistors are balanced.

15. A programmable transconductor as in claim 12 wherein the first and second selector circuits respectively comprise a first and second plurality of switch circuits.

16. A programmable transconductor as in claim 15 wherein the first and second plurality of switch circuits comprise CMOS transfer gate circuits.

17. A programmable transconductor as in claim 16 wherein the CMOS transfer gate circuits are enabled by digital control signals.

18. A programmable transconductor as in claim 12: wherein the first input circuit comprises a first gain block having a first input coupled to the first voltage input terminal, a second input coupled to the first feedback node, and an output; and a first transistor having a first current-handling terminal coupled to the first summing node, having a second current-handling terminal coupled to the first current output terminal, and having a control terminal coupled to the output of the first gain block; and wherein the second input circuit comprises a second gain block having a first input coupled to the second voltage input terminal, a second input coupled to the second feedback node, and an output; and a second transistor, having a first current-handling terminal coupled to the second summing node, having a second current-handling terminal coupled to the second current output terminal, and having a control terminal coupled to the output of the second gain block.

19. A programmable transconductor as in claim 18:

wherein each of the first inputs of the first and second gain blocks comprises a non-inverting input; and wherein each of the second inputs of the first and second gain blocks comprises an inverting input.

20. A programmable transconductor as in claim 18 wherein each of the first and second transistors comprises a transistor chosen from a group consisting of P-channel MOS transistors, N-channel MOS transistors, PNP bipolar transistors, and NPN bipolar transistors.

21. A programmable transconductor as in claim 12 wherein each of the first and second selector circuits are enabled by digital control signals, and wherein the first and second selected intermediate nodes are chosen to provide a specific value of transconductance from a range of selectable values.

22. A variable transconductor for generating a differential current between first and second current output terminals responsive to a differential voltage operably impressed between first and second voltage input terminals, comprising:

current source means configured to deliver a predetermined mount of current into both a first summing node and into a second summing node;

programmable resistor means including a string of individual resistors, the string having a first and second plurality of intermediate nodes, coupled between the first and second summing nodes for providing a current path therebetween in accordance with a differential voltage therebetween, and resulting in a net current into the first summing node equal to the predetermined amount of current delivered thereinto plus any current flowing through the resistor means into the first node from the second node, and resulting in a net current into the second summing node equal to the predetermined amount of current delivered thereinto plus any current flowing through the resistor means into the second node from the first node;

a first transistor configured to operably receive the net current into the first summing node, and for providing this net current to the first current output terminal;

a second transistor configured to operably receive the net current into the second summing node, and for providing this net current to the second current output terminal;

a first gain block having a first input coupled to the first voltage input terminal; having a second input coupled to one of the first and second plurality of intermediate nodes, and having an output coupled to the control terminal of the first transistor; and a second gain block having a first input coupled to the second voltage input terminal; having a second input coupled to another of the first and second plurality of intermediate nodes, and having an output coupled to the control terminal of the second transistor.

23. The variable transconductor of claim 22 wherein the resistor means includes:

a first plurality of switches, each coupling the second input of the first gain block to respective intermediate nodes of the first plurality of the multi-segmented resistor; and a second plurality of switches coupling the second input of the second gain block to respective intermediate nodes of the second plurality of the multi-segmented resistor.

* * * * *